United States Patent
Nesensohn (10) Patent No.: US 12,336,071 B2
(45) Date of Patent: Jun. 17, 2025

(54) DRIVER FOR LIGHTING MEANS

(71) Applicant: Tridonic GmbH & Co KG, Dornbirn (AT)

(72) Inventor: Christian Nesensohn, Götzis (AT)

(73) Assignee: Tridonic GmbH & Co KG, Dornbirn (AT)

( * ) Notice: Subject to any disclaimer, the term of this patent is extended or adjusted under 35 U.S.C. 154(b) by 47 days.

(21) Appl. No.: 18/261,543

(22) PCT Filed: Feb. 7, 2022

(86) PCT No.: PCT/EP2022/052829
§ 371 (c)(1),
(2) Date: Jul. 14, 2023

(87) PCT Pub. No.: WO2022/175125
PCT Pub. Date: Aug. 25, 2022

(65) Prior Publication Data
US 2024/0080954 A1   Mar. 7, 2024

(30) Foreign Application Priority Data
Feb. 18, 2021 (EP) .................................... 21157746

(51) Int. Cl.
*H05B 45/382* (2020.01)
*H05B 45/14* (2020.01)
(52) U.S. Cl.
CPC ........... *H05B 45/382* (2020.01); *H05B 45/14* (2020.01)

(58) Field of Classification Search
CPC .. H05B 45/382; H05B 45/14; H05B 45/3725; H05B 47/105; G01R 19/16547; H02J 9/02
See application file for complete search history.

(56) References Cited

U.S. PATENT DOCUMENTS 9,332,608 B2 * 5/2016 Jonsson ................... H04W 4/80
10,057,947 B2 * 8/2018 Wilson ........................ H02J 7/02
(Continued)

FOREIGN PATENT DOCUMENTS

JP   2011021120 A  *  2/2011
JP   2015023609       2/2015
(Continued)

OTHER PUBLICATIONS

PCT/EP2022/052829 International Search Report and Written Opinion dated May 12, 2022, 14 pages.
(Continued)

*Primary Examiner* — Abdullah A Riyami
*Assistant Examiner* — Syed M Kaiser
(74) *Attorney, Agent, or Firm* — Andrus Intellectual Property Law, LLP (57) ABSTRACT

The disclosure relates to a driver for lighting means (100) comprising: input terminals (101a, 101b) for an optionally rectified AC voltage; output terminals (104a, 104b) for supplying a LED load (105), a detection circuitry (102) connected to the input terminals (101a, 101b), configured to obtain a signal representing a frequency of the AC voltage and an amplitude of the peak of each cycle of the AC voltage, and a control circuit (103) being connected to the detection circuitry (102) and supplied with said signal.

16 Claims, 5 Drawing Sheets

(56) References Cited

U.S. PATENT DOCUMENTS

| | | | | |
|---|---|---|---|---|
| 2011/0012530 A1* | 1/2011 | Zheng | ............... | H02M 3/33523 |
| | | | | 315/294 |
| 2012/0187847 A1* | 7/2012 | Hamamoto | ............ | H05B 45/58 |
| | | | | 315/125 |
| 2017/0290110 A1* | 10/2017 | Wilson | ................... | H05B 45/38 |
| 2021/0006168 A1 | 1/2021 | Saes | | |

FOREIGN PATENT DOCUMENTS

| | | | | |
|---|---|---|---|---|
| WO | WO-2011021120 A2 * | 2/2011 | .............. | H02M 1/10 |
| WO | WO-2011045372 A1 * | 4/2011 | ......... | H05B 33/0815 |

OTHER PUBLICATIONS

European Patent Application No. EP 21 157.746,5, European Examination Report dated Dec. 4, 2023, 10 pages.

* cited by examiner

DRIVER FOR LIGHTING MEANS

CROSS REFERENCE TO RELATED APPLICATIONS

The present application is the U.S. national stage application of international application PCT/EP2022/052829 filed Feb. 7, 2022, which international application was published on Aug. 25, 2022 as International Publication WO 2022/175124. The international application claims priority to European Patent Application No. 21157746.5 filed Feb. 18, 2021.

TECHNICAL FIELD OF THE INVENTION

The present invention relates to a driver for lighting means and to a system comprising the driver for lighting means. In particular, the present disclosure deals with the detection of the frequency and the amplitude of an AC voltage supplied to a driver for lighting means.

BACKGROUND OF THE INVENTION

DC/AC detection circuitries for driver for lighting means are known as such. They often rely on a comparison of the input AC voltage with threshold values, so that the presence or non-presence of the input voltage crossing the threshold values can be used for detecting the lack of an AC voltage or the presence of a DC voltage, for example, for emergency lighting devices.

Various arrangements for lighting systems are known which provide both conventional and emergency lighting devices. Such emergency lighting devices are intended to be activated when the conventional lighting is no longer operative, because the mains voltage supplied to the conventional lighting device is no longer available or malfunctions. An emergency lighting device is typically powered by a battery or other energy storage device.

A conventional lighting device is controlled by an on/off switch by means of which a user (or control system) can control whether the lighting is illuminated or not. Generally, the emergency lighting device is intended to be automatically illuminated when the absence of mains power or the malfunction of mains power for the conventional lighting device is detected in some way.

A lighting system comprising an emergency lighting device and a conventional lighting device may be considered to have two operating modes. In a normal mode, when the direct mains supply is operating, normally (within the normal voltage range), a switched mains input, controlled by an on/off switch, is monitored, and the lamp is illuminated or extinguished in dependence upon the switched mains input.

In an emergency mode, when the mains supply is not available or is malfunctioning (is outside the normal voltage range), the lamp is illuminated automatically, irrespective of the status of the switched mains input, using power from a battery or other storage element.

In some lighting systems it is possible to power the lamp in an emergency from a DC voltage at the mains input (which is normally powered by AC), provided from a centralized battery storage system.

Therefore, there is a need for an improved driver allowing to measure the frequency and voltage of an AC voltage, in particular, of a mains voltage.

SUMMARY OF THE INVENTION

The object of the present disclosure is achieved by the solution provided in the enclosed independent claims. Advantageous implementations of the present disclosure are further defined in the dependent claims.

According to a first aspect, the disclosure relates to a driver for lighting means comprising: input terminals for an optionally rectified AC voltage or AC voltage or DC voltage; output terminals for supplying a LED load, a detection circuitry connected to the input terminals, configured to obtain a signal representing a frequency of the AC voltage and an amplitude of a peak of each cycle of the AC voltage, and a control circuit being connected to the detection circuitry and supplied with said signal.

This provides the advantage that lower component counts and costs are achieved. Moreover, higher miniaturization is achieved due to the lower component count and, furthermore, there is no need for a primary side controller in order to obtain the signal, since the control circuit can be situated on the secondary side of the driver.

In an embodiment, the control circuit is configured to adapt an operation parameter of the driver depending on the signal supplied to the control circuit.

This provides the advantage that the operation of the driver can easily be chosen depending on the operation parameter.

In an embodiment, the control circuit is configured to send out an information derived from the signal over a wirebound or a wireless interface of the driver.

This provides the advantage that the information can be sent out in an efficient and well-known way.

In an embodiment, the control circuit is configured to respond to the signal by switching the operation of the lighting means to an emergency lighting means operation.

In an embodiment, the control circuit comprises a comparator configured to compare the AC voltage with at least one defined threshold voltage, the detecting circuitry being configured to generate a signal representing timings of the AC voltage crossing the threshold value.

In an embodiment, the detection circuitry determines a rising edge threshold crossing of the AC voltage in order to produce a signal indicating the frequency of the AC voltage.

In an embodiment, the detection circuitry determines the time duration between a rising edge threshold crossing and a falling edge threshold crossing of the AC voltage in order to produce a signal indicating the peak amplitude of the AC voltage.

In an embodiment, the control circuit is configured to access a look-up table in order to convert the time duration between a rising edge threshold crossing and a falling edge threshold crossing of the AC voltage into a peak voltage value of the AC voltage.

In an embodiment, the driver comprises a flyback converter.

In an embodiment, the control circuit comprises a DALI interface.

According to a second aspect, the invention relates to a system comprising a central unit circuit connected to a driver according to the first aspect or any one of the implementation forms thereof, the driver being configured to communicate a peak voltage and a frequency of a AC supplied to the driver to the central unit.

According to yet another aspect, the invention relates to an emergency lighting unit, comprising a driver as defined above as well as lighting means supplied by said driver.

BRIEF DESCRIPTION OF THE DRAWINGS

The invention will be explained in the followings together with the figures.

DETAILED DESCRIPTION OF THE PREFERRED EMBODIMENTS

Aspects of the present invention are described herein in the context of a driver for lighting means.

The present invention is described more fully hereinafter with reference to the accompanying drawings, in which various aspects of the present invention are shown. This invention however may be embodied in many different forms and should not be construed as limited to the various aspects of the present invention presented through this disclosure. Rather, these aspects are provided so that this disclosure will be thorough and complete, and will fully convey the scope of the present invention to those skilled in the art. The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus.

Various aspects of a driver for lighting means will be presented. However, as those skilled in the art will readily appreciate, these aspects may be extended to aspects of driver for lighting means without departing from the invention.

The term "LED luminaire" shall mean a luminaire with a light source comprising one or more LEDs or OLEDs. LEDs are well-known in the art, and therefore, will only briefly be discussed to provide a complete description of the invention.

It is further understood that the aspect of the present invention might contain integrated circuits that are readily manufacturable using conventional semiconductor technologies, such as complementary metal-oxide semiconductor technology, short "CMOS". In addition, the aspects of the present invention may be implemented with other manufacturing processes for making optical as well as electrical devices. Reference will now be made in detail to implementations of the exemplary aspects as illustrated in the accompanying drawings. The same references signs will be used throughout the drawings and the following detailed descriptions to refer to the same or like parts.

Figure 1:
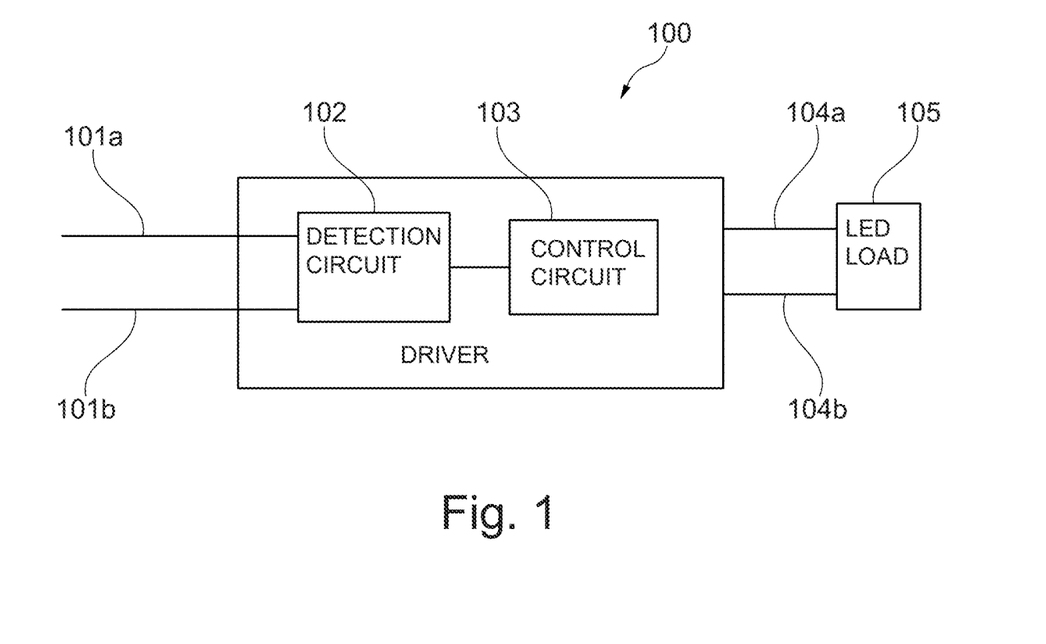
FIG. 1 shows an embodiment of a driver for lighting means.

Now referring to FIG. 1, a driver 100 for lighting means is shown.

The driver for lighting means 100 comprises:

input terminals 101a, 101b for an optionally rectified mains AC voltage (the rectifier of the driver not being shown in the figures) or AC voltage or DC voltage;

output terminals 104a, 104b for supplying a LED load 105, such as e.g. an emergency lighting load and/or a lighting load supplied off the mains AV voltage, a detection circuitry 102 connected to the input terminals 101a, 101b, configured to obtain a signal representing or encoding a frequency of the AC voltage and an amplitude of the peak of each cycle of the AC voltage, and a control circuit 103 being connected to the detection circuitry 102 and supplied with said signal. Preferably, it is the control circuit 103 deriving a value for the frequency and the peak of the mains voltage by processing the signal from the detection circuit.

The frequency of the peak of threshold crossing events can be used in order to have an information as to the frequency of the AC voltage.

Furthermore, the duty cycle ($T_{on}$ time) of the time periods, during which the supplied AC voltage is higher than a given threshold value can be used by the control circuit in order to determine, for example, using an analytical function or a look-up table, the mains voltage peak value at a given frequency.

Information as to the mains voltage amplitude and the frequency can be used, for example, to change operating parameters of the driving circuitry. One example is the switching from regular lighting operation to an emergency lighting operation mode as described above, wherein the lighting means are supplied off a DC voltage, e.g. supplied by a central or local battery.

Furthermore, this information can be send out, for example, upon request over a bus communication, such as, for example, a DALI bus.

Figure 2:
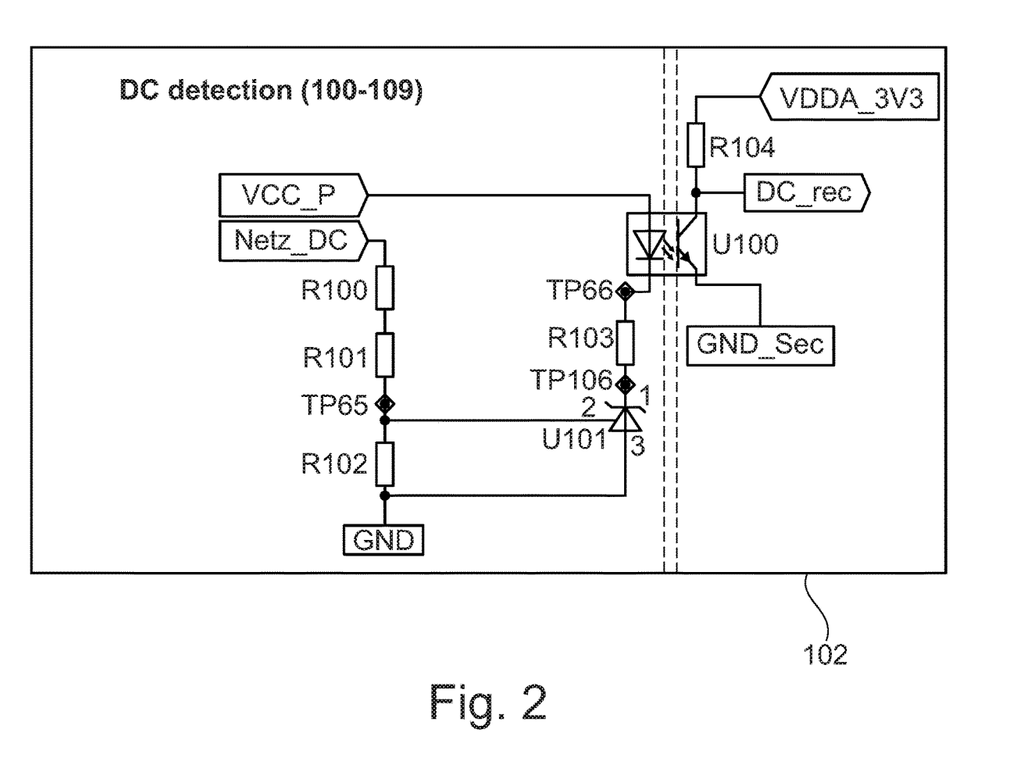
FIG. 2 shows an embodiment of a detection circuit for a driver for lighting means.

For flyback/buck topologies of the driver 100 with a microcontroller on a secondary side, the circuit shown in FIG. 2 can be used as detection circuit 102 to detect, for example, a mains state (AC, DC or no mains). The mains voltage is divided by a resistive divider having resistors R100, R101 and R102 and fed to a threshold element, such as e.g. a reference diode. If the voltage is higher than the threshold voltage implemented by the diode, the diode conducts. The output signal of the threshold element can be transmitted in a galvanically isolating manner. In the embodiment, the diode current flows through a LED of an optocoupler U100 so that the photo transistor of U100 conducts. On the secondary side of the optocoupler, this leads to the signal AC shown in FIG. 3, wherein the curve 300 represents a mains voltage and the curve 301 represents a reference signal 301.

Figure 3:
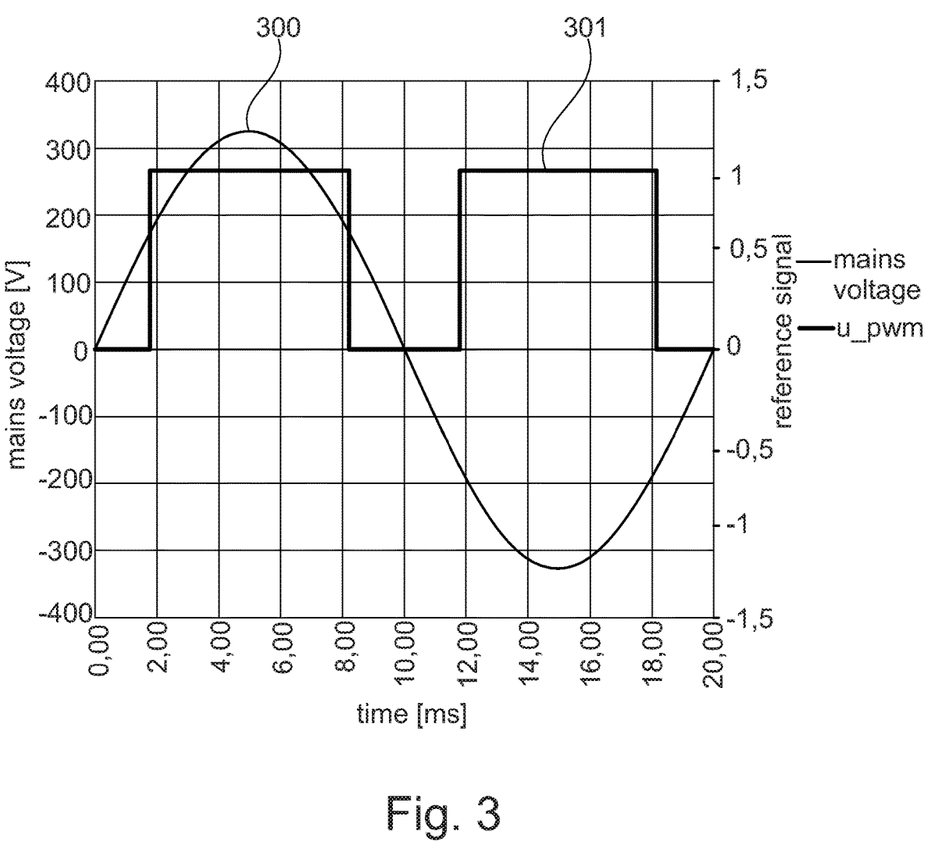
FIG. 3 shows voltage signals versus time according to an embodiment.

In an embodiment, the signal shown in FIG. 3 can also be used for measuring the mains frequency. If the time between every rising edges is counted delta_t, the frequency f can be calculated as f=1/(delta_t*2).

In another embodiment, for mains voltage measurement, the pulse width of the on pulse has to be counted. The pulse width is relating to the peak voltage of the input signal and, therefore, also to the effective mains voltage.

Figure 4:
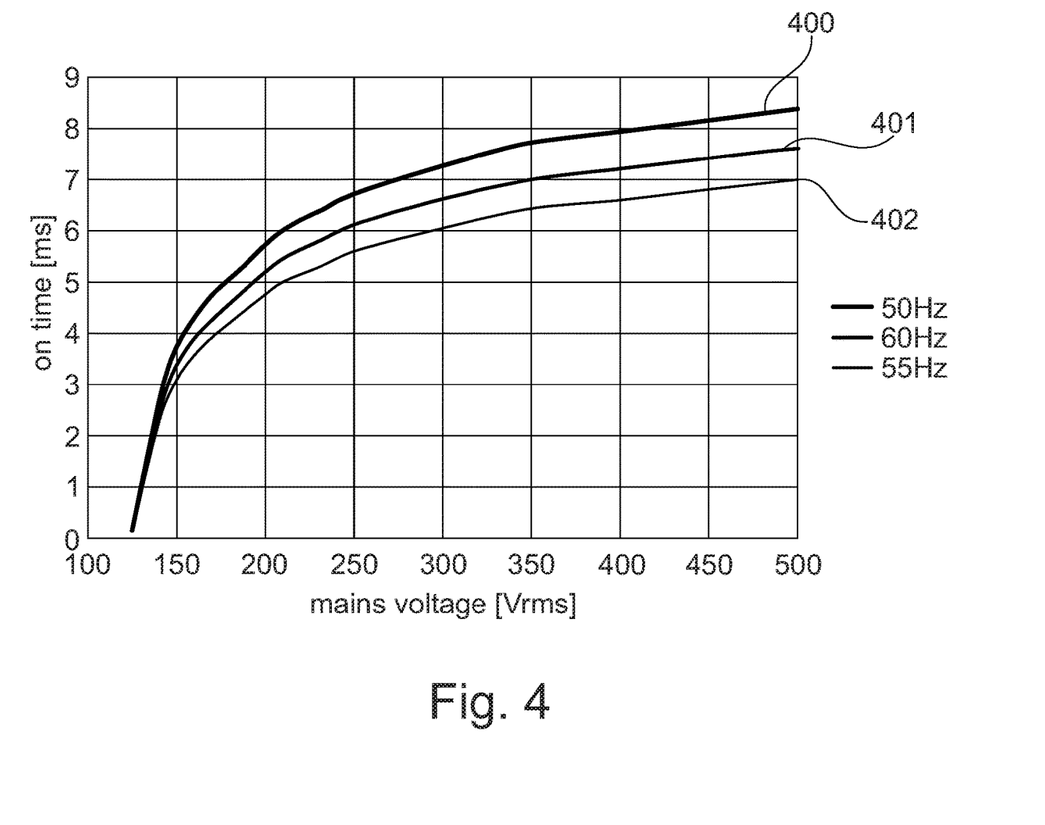
FIG. 4 shows on time signals versus mains voltage at constant frequencies according to an embodiment.

A look-up table in the microcontroller or control circuit 103 can give the resulting input voltage for one specific frequency, as shown in FIG. 4, wherein on times are shown as a function of mains voltage. For the curve 400, the frequency is 50 Hz, for the curve 401, the frequency is 55 Hz, while for the curve 402, the frequency is 60 Hz.

In this embodiment, it is not necessary to store look-up tables for all possible frequencies in the microcontroller. If the look-up table of one specific frequency is known, the mains voltage can be scaled simply by the factor of the frequency given in the look-up table over the measured frequency (f_lookuptable/f_measured).

Moreover, depending on the required accuracy, the following options can be used to save memory:

1) Limit the detectable range, since the smaller the range, the less the needed data;
2) Split the curve into segments and linearize. This means that only a few points are needed, the values in between can be calculated.

Furthermore, in order to increase the accuracy, the following options can be used:
1) Shift the reference as high as possible, since the higher the reference, the bigger the deviation of the on time but the minimum detectable voltage rises as well;
2) Do a calibration in production. For example, apply a controlled voltage and instruct the device which value it has. For example, query the measured voltage and instruct the device about the failure for future compensation.

As mentioned above and as it can be seen in FIG. 4, for different frequencies, different on time/mains voltage curves can be prepared, which can lead to high requirements on the memory power.

Therefore, in another embodiment, only a limited number or even only one on time (t)/mains voltage curve is available, which is then calibrated as mentioned above. This advantageously leads to a reduction of data to be provided in a memory.

Therefore, by measuring the on time and the off time of an already existing AC/DC detection signal, the mains frequency as well as the mains voltage can be calculated. By making use of specific algorithms, this works for different mains frequencies with the same accuracy without the need of additional memory or look-up tables.

Moreover, during the manufacturing of the device, each device itself can be calibrated, such that the curve stored in the look-up table actually corresponds to that specific device.

Figure 5:
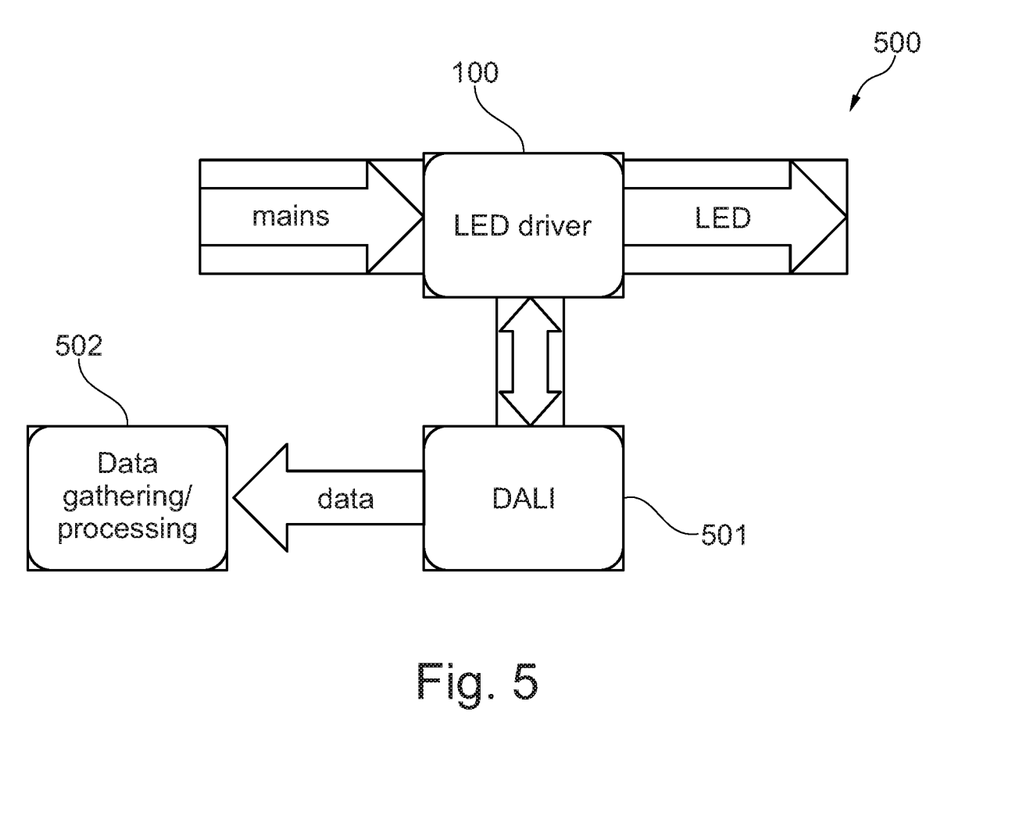
FIG. 5 shows a system comprising a driver for lighting means according to an embodiment.

FIG. 5 shows a system 500 comprising a driver 100 for lighting means according to an embodiment.

The system 500 shown in FIG. 5 comprises an LED driver 100 with a circuitry and frequency/amplitude evaluation as described before. Furthermore, the system 500 comprises a DALI control unit 501, which pulls the information from the driver 100 and may be adapted to send it to a data gathering/processing unit 502, which might be a central unit of a building in order, for example, to determine the power consumption of different appliances in a building.

In general, the LED driver 100 is configured to measure, for example, the mains data and the DALI control 501 is configured to query the mains data, such as mains voltage, mains current, mains power, mains frequency, etc. Those data can, then, be used by any algorithm for further data analysis (e.g., tracking power consumption for calculating energy cost). This algorithm can be cloud based or local.

Communication protocols such as e.g. "DALI 2 extensions" may command mains voltage and frequency measurements to be executed by the driver, e.g. triggered by a (e.g. extended) DALI command over a bus interface of the driver.

As shown in the embodiment, the driver may be an isolated driver. E.g. the isolation can be implemented by a transformer such as e.g. the transformer of a switched isolated converter, such as e.g. a flyback converter.

The detection circuit is arranged on the primary (mains) side of the isolation stage of the driver. The control circuit may be arrange on the primary side or the secondary side of the isolation stage. In the latter alternative, the detection circuit sends the detection signal to the control circuit e.g. using an optocoupler.

The control circuit may be a microcontroller.

The control circuit may be arranged on the secondary side of the isolated driver, and furthermore, to issue a control signal to a switch of a switched converter (e.g. buck or boost converter) arranged on the secondary side of the switched isolated converter.

While various embodiments of the present invention have been described above, it should be understood that they have been presented by way of example only and not limitation. Numerous changes to the disclosed embodiments can be made in accordance with the disclosure herein without departing from the spirit of scope of the invention. Thus, the breadth and scope of the present invention should not be limited by any of the above-described embodiments. Rather, the scope of the invention should be defined in accordance with the following claims and their equivalence.

Although the invention has been illustrated and described with respect to one or more implementations, equivalent alternations and modifications will occur to those skilled in the art upon the reading of the understanding of the specification and the annexed drawings. In addition, while a particular feature of the invention may have been disclosed with respect to only of the several implementations, such features may be combined with one or more other features of the other implementations as may be desired and advantage for any given or particular application.

The invention claimed is:

1. A driver (100) for an LED load (105) comprising:
input terminals (101a, 101b) for an AC voltage;
output terminals (104a, 104b) for supplying the LED load (105);
a detection circuitry (102) configured to obtain a signal representing a frequency of the AC voltage and an amplitude of the peak of each cycle of the AC voltage; and
a control circuit (103) being connected to the detection circuitry (102) and supplied with said signal;
wherein the driver (100) comprises a switched isolated converter, the control circuit is arranged on the secondary side of the switched isolated converter, and the detection circuit is on the primary side of the switched isolated converter, and
the detection circuitry comprises a reference diode configured to compare the AC voltage with a defined threshold voltage and said signal includes timings of the AC voltage crossing the threshold value.

2. The driver (100) of claim 1, wherein the control circuit (103) is configured to adapt an operation parameter of the driver (100) depending on the signal supplied to the control circuit (103).

3. The driver (100) of claim 1, wherein the control circuit (103) is configured to send out an information derived from the signal over a wire-bound or a wireless interface of the driver (100).

4. The driver (100) of claim 1, wherein the control circuit (103) is configured to respond to the signal by switching the operation mode to an emergency lighting operation mode in which the LED load is powered with DC voltage from a battery.

5. The driver (100) of claim 1, wherein the detection circuitry (102) is configured to determine a rising edge threshold crossing of the AC voltage in order to produce the signal indicating the frequency of the AC voltage.

6. The driver (100) of claim 1, wherein the detection circuitry (102) is configured to determine the time duration between a rising edge threshold crossing and a falling edge threshold crossing of the AC voltage in order to produce the signal indicating the peak amplitude of the AC voltage.

7. The driver (100) of claim 6, wherein the control circuit (103) is configured to access a look-up table in order to convert the time duration between the raising edge threshold crossing and the falling edge threshold crossing of the AC voltage into a peak voltage value of the AC voltage.

8. The driver of claim 1, further arranged to issue a control signal to a switch on the secondary side of the switched isolated converter.

9. The driver (100) of claim 1, wherein the control circuit (103) comprises a bus interface.

10. A system (500) comprising a central unit circuit (502) connected to a driver (100) according to claim 1, the driver (100) being configured to communicate a peak voltage and a frequency of the AC voltage supplied to the driver (100) to the central unit circuit (502).

11. An emergency lighting unit, comprising a driver according to claim 1 as well as an LED load (105) supplied power by said driver.

12. The driver of claim 1 wherein the switched isolated converter is a flyback converter.

13. The driver of claim 8 wherein the switched isolated converter is a buck or boost converter.

14. The driver of claim 9 wherein the bus interface is a DALI interface.

15. The driver of claim 1 further comprising an optocoupler, wherein the detection circuit sends the signal to the control circuit using the optocoupler.

16. A driver (100) for an LED load (105) comprising:
input terminals (101a, 101b) for an AC voltage;
output terminals (104a, 104b) for supplying the LED load (105);
a detection circuitry (102) configured to obtain a signal representing a frequency of the AC voltage and an amplitude of the peak of each cycle of the AC voltage; and
a control circuit (103) being connected to the detection circuitry (102) and supplied with said signal;
wherein the detection circuitry (102) determines a time duration between a rising edge threshold crossing and a falling edge threshold crossing of the AC voltage in order to produce a signal indicating the peak amplitude of the AC voltage; and
wherein the control circuit (103) is configured to access a look-up table in order to convert the time duration between the raising edge threshold crossing and the falling edge threshold crossing of the AC voltage into a peak voltage value of the AC voltage.

* * * * *